United States Patent [19]

Satomura et al.

[11] 4,220,546
[45] Sep. 2, 1980

[54] PIEZOELECTRIC CERAMIC COMPOUNDS

[75] Inventors: Hiroshi Satomura, Hatogaya; Katsuyoshi Takano, Tokyo, both of Japan

[73] Assignee: Toko, Inc., Tokyo, Japan

[21] Appl. No.: 57,724

[22] Filed: Jul. 16, 1979

[30] Foreign Application Priority Data

Jul. 25, 1978 [JP] Japan ............................ 53-89933

[51] Int. Cl.$^2$ .................. C04B 35/46; C04B 35/48; C04B 35/50
[52] U.S. Cl. ........................................ 252/62.9
[58] Field of Search .................................. 252/62.9

[56] References Cited

U.S. PATENT DOCUMENTS 3,533,951  10/1970  Tsubouchi et al. ............... 252/62.9

FOREIGN PATENT DOCUMENTS

| | | | |
|---|---|---|---|
| 2063420 | 7/1971 | Fed. Rep. of Germany | 252/62.9 |
| 45-32463 | 10/1970 | Japan | 252/62.9 |
| 46-16631 | 5/1971 | Japan | 252/62.9 |
| 47-21519 | 6/1972 | Japan | 252/62.9 |
| 1401389 | 7/1975 | United Kingdom | 252/62.9 |

Primary Examiner—Jack Cooper
Attorney, Agent, or Firm—J. Harold Nissen

[57] ABSTRACT

Piezoelectric ceramics are provided consisting of a ternary system composition of $PbTiO_3$-$PbZrO_3$-$La(Mn_{1-4\alpha}Ni_{3\alpha}W_\alpha)O_3$ where $\alpha$ is in the range of $3/40 \leq \alpha \leq \frac{1}{4}$.

1 Claim, 12 Drawing Figures

Fig. 3A α=10/40  0 1 2 3 4 5 MICRON
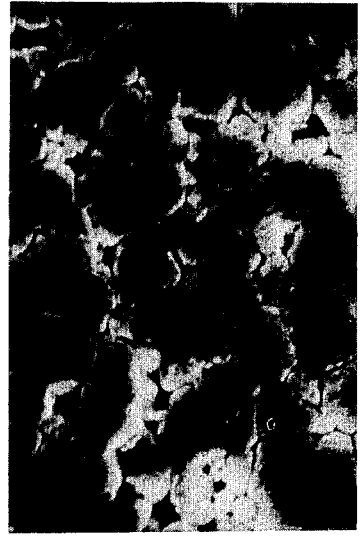
Fig. 3B α=5/40  0 1 2 3 4 5 MICRON
Fig. 3C α=0  0 1 2 3 4 5 MICRON

① $0.9Pb(Ti_xZr_{1-x})O_3 + 0.03La(Mn_{7/10}Ni_{9/40}W_{3/40})O_3$
② $Pb_{0.95}Sr_{0.05}(Ti_xZr_{1-x})O_3$
③ $[0.98Pb(Ti_xZr_{1-x})O_3 - 0.02W_{O3}] + 0.75$ wt % $MnO_2$

PIEZOELECTRIC CERAMIC COMPOUNDS

BACKGROUND OF THE INVENTION

This invention relates to piezoelectric ceramic compounds consisting of ternary system piezoelectric ceramic compounds $PbTiO_3\text{-}PbZrO_3\text{-}La(Mn_{1-1\alpha} Ni_{3\alpha} W_\alpha)O_3$ in which lanthanum manganate-nickelate-tungstate $La(Mn_{1-4\alpha} Ni_{3\alpha} W_\alpha) O_3$ is solid-soluted in a binary system piezoelectric ceramic compound of lead titanate-zirconate $PbTiO_3\text{-}PbZrO_3$.

In the prior art of piezoelectric ceramic compounds, compounds consisting of a binary system piezoelectric ceramic compound of lead titanate-zirconate $PbTiO_3\text{-}PbZrO_3$ and niobium added thereto are known. Although these compounds have a relatively high specific resistivity of $10^{13}$ to $10^{14}$ Ω cm, secular variation of the electrical properties of these compounds is not small enough. In general, it is recognized that the secular variation of the electrical properties of a piezoelectric ceramic compound depends upon an absolute amount of inner space charge and the manner of transmission of inner space charge of the piezeoelectric compound. In a piezoelectric ceramic compound having a large specific resistivity, since the transmission of inner space charge is effected slowly, it is difficult to realize a stable distribution of a charge in a short period of time. Thus, piezoelectric ceramic compounds having a high specific resistivity do not have a satisfactory property from the viewpoint of secular variation. Accordingly, it is not always advantageous that a piezoelectric ceramic compound has a high specific resistivity. However, there has been a problem in that it is difficult to realize simultaneously a reduction of specific resistivity, a reduction of secular variation of electrical properties, and an improvement of piezoelectric properties such as the mechanical quality factor $Q_M$ of a piezoelectric ceramic compound, because the reduction of specific resistivity and inner specific charge cause to deteriorate the mechanical quality factor $Q_M$.

Also, in another prior art of piezoelectric ceramic compounds, compounds consisting of a binary system piezoelectric ceramic compound of lead titanate-zirconate $PbTiO_3\text{-}PbZrO_3$ and chromium added thereto are known. Although these compounds have a relatively small specific resistivity and have a satisfactory property from the viewpoint of secular variation, it is difficult to obtain a compound having high mechanical quality factor $Q_M$. Also in the case of these compounds, there have been problems in that it is difficult to realize simultaneously a reduction of specific resistivity, a reduction of secular variation of electrical properties, and an increase of the mechanical quality factor $Q_M$ of a piezoelectric ceramic compound.

SUMMARY OF THE INVENTION

It is an object of the present invention to provide piezoelectric ceramic compounds, the theoretical density ratio of which is large, crystal structure of which is dense, the secular change of electrical properties such as resonance frequency is small, the mechanical factor $Q_M$ is above a predetermined value, and the temperature coefficient of resonance frequency of which is small over a wide range of temperature, by selecting the composition of piezoelectric ceramic compounds having the molecular formula $La(Mn_{1-4\alpha}\text{-}Ni_{3\alpha}W_\alpha)O_3\text{-}PbTiO_3\text{-}PbZrO_3$.

The piezoelectric ceramic compounds in accordance with the present invention are suitable for piezoelectric filters, particularly piezoelectric filters in communication devices and filters of the elastic surface wave type, as well as for ultrasonic devices and sensing devices.

BRIEF DESCRIPTION OF THE DRAWINGS

FIGS. 3A, 3B and 3C illustrate electron microscopic photographs revealing the difference of crystal grain growth by changing the $\alpha$ value in the formula.

PREFERRED EMBODIMENTS OF THE INVENTION

Figure 1:
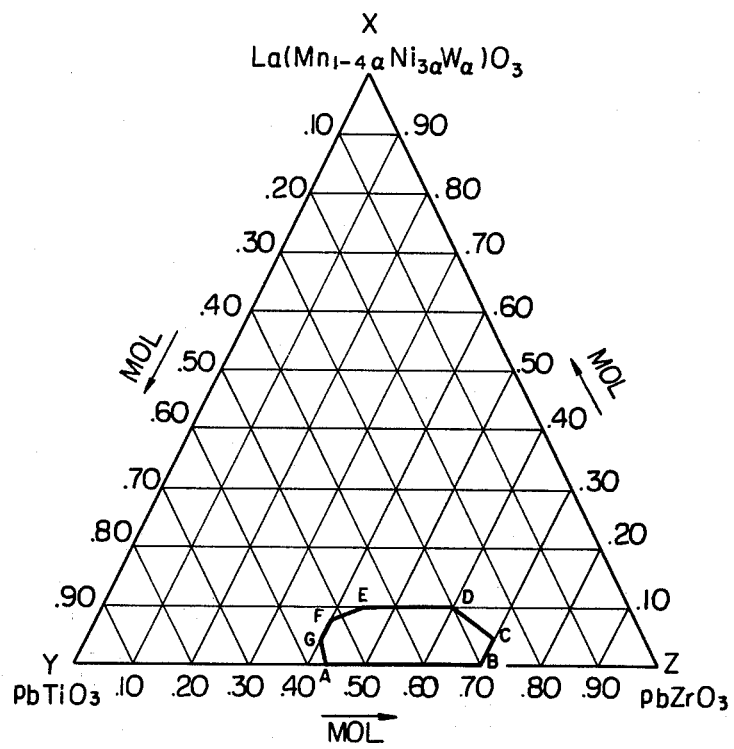
FIG. 1 shows a ternary diagram explaining the range of composition of piezoelectric ceramic compounds in accordance with the present invention.

Piezoelectric ceramic compounds in accordance with the present invention are produced by means of a powder metallurgical process from oxide materials and the like. An example of such process is described in the following. PbO or $Pb_3O_4$, $La_2O_3$, NiO, $WO_3$, $MnO_2$, $TiO_2$, $ZrO_2$; a hydroxide, or; a carbonate and the like weighed and mixed in water in a ball-mill for 24 hours so as to produce one of the compositions of sample Nos. 1 through 85 of List 1. The mixed material is calcinated at a temperature range of from 800° C. to 850° C. for 2 hours, then is powdered by means of a ball-mill for a period of from 20 hours to 30 hour with a predetermined amount of organic binding agents which are dissolved in water, then is dried, and then meshed through grade 60 Mesh. The product as produced in accordance with the above described process is pressed and shaped into a disc 20 mm in diameter and 2 mm in thickness, and sintered into a piezoelectric ceramic compound at a temperature range of from 1110° C. to 1230° C. for a period of from 2 hours to 4 hours. This sintering temperature is lower than the prior art sintering temperature of approximately 1300° C. Accordingly, the vaporization of lead oxide in the composition is reduced. The piezoelectric ceramic compound disc thus produced is ground into the thickness of 1 mm, then a pair of silver electrodes is printed on both planes of the disc, and then the disc is polarized by a direct current voltage gradient of 3 KV/mm through 4 KV/mm in silicone oil in a temperature range of from 80° C. to 150° C.

List 1 shows the main properties of Sample Nos. 1 through 85, each of which is produced with a predetermined composition under appropriate conditions in the production process. The main properties include a sintering temperature in °C, electro-mechanical coupling coefficient Kp in %, relative dielectric constant $\epsilon_{33}^T/\epsilon_0$ and mechanical quality factor $Q_M$.

List 1

| Sample No. | Composition (Molar Fraction) | | | | Sintering Temperature | Electro-Mechanical Coupling Coefficient | Relative Dielectric Constant | Mechanical Quality Factor |
|---|---|---|---|---|---|---|---|---|
| | x | y | z | α | | | | |
| 1 (A) | 0.005 | 0.565 | 0.43 | 3/40 | 1180 | 30 | 450 | 1650 |
| 2 (B) | 0.005 | 0.295 | 0.70 | 3/40 | 1180 | 25 | 230 | 1880 |
| 3 (C) | 0.05 | 0.25 | 0.70 | 3/40 | 1140 | 29.5 | 430 | 1850 |
| 4 (D) | 0.10 | 0.30 | 0.60 | 3/40 | 1120 | 27 | 850 | 680 |
| 5 (E) | 0.10 | 0.45 | 0.45 | 3/40 | 1120 | 31 | 1750 | 780 |
| 6 (F) | 0.08 | 0.51 | 0.41 | 3/40 | 1140 | 30 | 1470 | 1050 |
| 7 (G) | 0.05 | 0.55 | 0.40 | 3/40 | 1150 | 35.5 | 880 | 1330 |
| 8 | 0.05 | 0.47 | 0.48 | 3/40 | 1130 | 48 | 1400 | 1200 |
| 9 | 0.05 | 0.47 | 0.48 | 4/40 | 1150 | 49.5 | 1410 | 1225 |
| 10 | 0.05 | 0.47 | 0.48 | 5/40 | 1150 | 51 | 1420 | 1165 |
| 11 | 0.05 | 0.47 | 0.48 | 8/40 | 1180 | 53.5 | 1680 | 1000 |
| 12 | 0.05 | 0.47 | 0.48 | 10/40 | 1210 | 48.5 | 1250 | 300 |
| 13 | 0.04 | 0.49 | 0.47 | 3/40 | 1160 | 46.5 | 1200 | 1350 |
| 14 | 0.04 | 0.49 | 0.47 | 4/40 | 1160 | 48.5 | 1250 | 1450 |
| 15 | 0.04 | 0.49 | 0.47 | 5/40 | 1160 | 50.5 | 1300 | 1520 |
| 16 | 0.04 | 0.49 | 0.47 | 8/40 | 1180 | 47 | 1260 | 1280 |
| 17 | 0.04 | 0.49 | 0.47 | 10/40 | 1230 | 44 | 1190 | 355 |
| 18 | 0.025 | 0.495 | 0.48 | 0 | 1160 | 40 | 950 | 900 |
| 19 | 0.025 | 0.495 | 0.48 | 1/40 | 1160 | 42 | 980 | 1100 |
| 20 | 0.025 | 0.495 | 0.48 | 2/40 | 1170 | 44 | 1070 | 1300 |
| 21 | 0.025 | 0.495 | 0.48 | 3/40 | 1170 | 45.5 | 1110 | 1600 |
| 22 | 0.025 | 0.495 | 0.48 | 4/40 | 1170 | 47.5 | 1150 | 1730 |
| 23 | 0.025 | 0.495 | 0.48 | 5/40 | 1170 | 49.5 | 1200 | 1680 |
| 24 | 0.025 | 0.495 | 0.48 | 6/40 | 1170 | 52 | 1230 | 1580 |
| 25 | 0.025 | 0.495 | 0.48 | 7/40 | 1170 | 54 | 1250 | 1500 |
| 26 | 0.025 | 0.495 | 0.48 | 8/40 | 1190 | 52 | 1200 | 1380 |
| 27 | 0.025 | 0.495 | 0.48 | 9/40 | 1190 | 48 | 1100 | 900 |
| 28 | 0.025 | 0.495 | 0.48 | 10/40 | 1230 | 46 | 950 | 400 |
| 29 | 0.05 | 0.45 | 0.50 | 3/40 | 1140 | 53.5 | 1400 | 665 |
| 30 | 0.05 | 0.45 | 0.50 | 4/40 | 1150 | 57 | 1500 | 720 |
| 31 | 0.05 | 0.45 | 0.50 | 5/40 | 1150 | 60 | 1650 | 790 |
| 32 | 0.05 | 0.45 | 0.50 | 8/40 | 1160 | 60 | 1900 | 1000 |
| 33 | 0.05 | 0.45 | 0.50 | 10/40 | 1180 | 57 | 1700 | 250 |
| 34 | 0.07 | 0.43 | 0.50 | 3/40 | 1110 | 46 | 1800 | 600 |
| 35 | 0.07 | 0.43 | 0.50 | 4/40 | 1130 | 46.5 | 1700 | 680 |
| 36 | 0.07 | 0.43 | 0.50 | 5/40 | 1130 | 46.5 | 1550 | 780 |
| 37 | 0.07 | 0.43 | 0.50 | 8/40 | 1150 | 51.5 | 1800 | 970 |
| 38 | 0.07 | 0.43 | 0.50 | 10/40 | 1170 | 47 | 1550 | 400 |
| 39 | 0.02 | 0.47 | 0.51 | 3/40 | 1170 | 61 | 1260 | 1200 |
| 40 | 0.02 | 0.47 | 0.51 | 4/40 | 1170 | 65 | 1275 | 1350 |
| 41 | 0.02 | 0.47 | 0.51 | 5/40 | 1170 | 61 | 1290 | 1280 |
| 42 | 0.02 | 0.47 | 0.51 | 8/40 | 1190 | 59.5 | 1320 | 1250 |
| 43 | 0.02 | 0.47 | 0.51 | 10/40 | 1230 | 57 | 1300 | 200 |
| 44 | 0.03 | 0.45 | 0.52 | 3/40 | 1170 | 68 | 800 | 750 |
| 45 | 0.03 | 0.45 | 0.52 | 4/40 | 1170 | 70 | 935 | 700 |
| 46 | 0.03 | 0.45 | 0.52 | 5/40 | 1170 | 71 | 990 | 650 |
| 47 | 0.03 | 0.45 | 0.52 | 8/40 | 1190 | 72.5 | 1170 | 450 |
| 48 | 0.03 | 0.45 | 0.52 | 10/40 | 1230 | 69 | 1050 | 180 |
| 49 | 0.02 | 0.52 | 0.46 | 3/40 | 1170 | 43 | 800 | 2350 |
| 50 | 0.02 | 0.52 | 0.46 | 4/40 | 1170 | 47.5 | 820 | 2400 |
| 51 | 0.02 | 0.52 | 0.46 | 5/40 | 1180 | 49.5 | 850 | 2300 |
| 52 | 0.02 | 0.52 | 0.46 | 8/40 | 1180 | 41.5 | 885 | 1760 |
| 53 | 0.02 | 0.52 | 0.46 | 10/40 | 1210 | 37 | 790 | 350 |
| 54 | 0.03 | 0.35 | 0.62 | 3/40 | 1150 | 38 | 400 | 2500 |
| 55 | 0.03 | 0.35 | 0.62 | 4/40 | 1160 | 39.5 | 390 | 2650 |
| 56 | 0.03 | 0.35 | 0.62 | 5/40 | 1160 | 42 | 385 | 2650 |
| 57 | 0.03 | 0.35 | 0.62 | 8/40 | 1160 | 38.5 | 380 | 2300 |
| 58 | 0.03 | 0.35 | 0.62 | 10/40 | 1180 | 36 | 370 | 550 |
| 59 | 0.03 | 0.53 | 0.44 | 3/40 | 1170 | 42.5 | 800 | 1900 |
| 60 | 0.03 | 0.51 | 0.46 | 3/40 | 1170 | 44.5 | 890 | 1850 |
| 61 | 0.03 | 0.50 | 0.47 | 3/40 | 1170 | 50 | 995 | 1750 |
| 62 | 0.03 | 0.49 | 0.48 | 3/40 | 1170 | 52.5 | 1110 | 1600 |
| 63 | 0.03 | 0.47 | 0.50 | 3/40 | 1170 | 65 | 1380 | 1280 |
| 64 | 0.03 | 0.46 | 0.51 | 3/40 | 1170 | 70 | 1510 | 1050 |
| 65 | 0.02 | 0.54 | 0.44 | 3/40 | 1170 | 40 | 640 | 2150 |
| 66 | 0.01 | 0.51 | 0.48 | 3/40 | 1190 | 41.5 | 855 | 1550 |

List 1-continued

| Sample No. | Composition (Molar Fraction) | | | | Sintering Temperature | Electro-Mechanical Coupling Coefficient | Relative Dielectric Constant | Mechanical Quality Factor |
|---|---|---|---|---|---|---|---|---|
| | x | y | z | α | | | | |
| 67 | 0.05 | 0.50 | 0.45 | 3/40 | 1150 | 43 | 1175 | 1280 |
| 68 | 0.07 | 0.47 | 0.46 | 3/40 | 1130 | 39.5 | 1580 | 1050 |
| 69 | 0.02 | 0.46 | 0.52 | 3/40 | 1180 | 64.5 | 720 | 1200 |
| 70 | 0.03 | 0.42 | 0.55 | 3/40 | 1170 | 53.5 | 690 | 1280 |
| 71 | 0.03 | 0.39 | 0.58 | 3/40 | 1170 | 46 | 475 | 1590 |
| 72 | 0.05 | 0.43 | 0.52 | 3/40 | 1150 | 63.5 | 1500 | 650 |
| 73 | 0.05 | 0.43 | 0.52 | 5/40 | 1150 | 64.5 | 1950 | 530 |
| 74 | 0.05 | 0.43 | 0.52 | 8/40 | 1160 | 63.5 | 1800 | 620 |
| 75 | 0.05 | 0.43 | 0.52 | 10/40 | 1170 | 62 | 1700 | 750 |
| 76 | 0.03 | 0.33 | 0.64 | 3/40 | 1170 | 36 | 375 | 2850 |
| 77 | 0.03 | 0.31 | 0.66 | 3/40 | 1170 | 34 | 360 | 3150 |
| 78 | 0.03 | 0.29 | 0.68 | 3/40 | 1170 | 32 | 350 | 3500 |
| 79 | 0.05 | 0.35 | 0.60 | 3/40 | 1160 | 38.5 | 495 | 1480 |
| 80 | 0.05 | 0.30 | 0.65 | 3/40 | 1150 | 32 | 450 | 2000 |
| 81 | 0.07 | 0.38 | 0.55 | 3/40 | 1130 | 44 | 870 | 1050 |
| 82 | 0.07 | 0.35 | 0.58 | 3/40 | 1130 | 38.5 | 720 | 1250 |
| 83 | 0.07 | 0.40 | 0.53 | 3/40 | 1130 | 47 | 1250 | 730 |
| 84 | 0.09 | 0.39 | 0.52 | 3/40 | 1110 | 39.5 | 2050 | 480 |
| 85 | 0.09 | 0.36 | 0.55 | 3/40 | 1110 | 39.5 | 1100 | 650 |

The range defined by the points A, B, C, D, E, F and G, is illustrated in the ternary diagram of FIG. 1. The points A, B, C, D, E, F and G correspond to Sample Nos. 1, 2, 3, 4, 5, 6 and 7, respectively.

Figure 2:
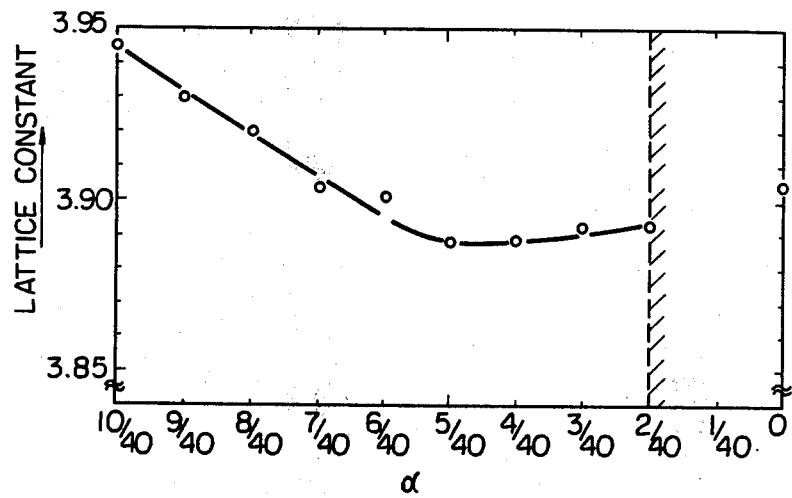
FIG. 2 shows a graph explaining the changes of lattice constant of a crystal.

It has been confirmed that $La(Mn_{1-4\alpha} Ni_{3\alpha} W_\alpha)O_3$, which is the third component of piezoelectric ceramic compounds in accordance with the present invention, has a cubic perovskite structure of a crystal where α is 10/40 to 2/40 and is easily synthesized by means of sintering in the air. As shown in FIG. 2 which illustrates the changes of the lattice constant of a crystal of $A^{+3} B^{+3} O_3$ type in the B site of which an appropriate amount of Mn is solid-soluted, the change of the lattice constant is small and the structure of the crystal is dense when the value of α is approximately from 7/40 to 2/40. In addition, when the value of α is in the above mentioned range, it has been found the crystalization is excellent by means of X-ray diffraction, and it is easy to effect the solid-solution into $PbTiO_3$-$PbZrO_3$. However, when the value of α is below 2/40, it is difficult to effect the sintering in air, and the crystal is in the state of mixed crystal, and accordingly, is not in perfect form. In FIG. 2, it should be noted that the value corresponding to α=0 is obtained in accordance with a vacuum sintering process at 1020° C.

It has been found that, if $La(Mn_{1-4\alpha} Ni_{3\alpha} W_\alpha)O_3$ having a semiconductive cubic perovskite type structure is solid-soluted with $PbTiO_3$-$PbZrO_3$, the solid-solution is effected at a relatively low temperature range of approximately from 1110° C. to 1230° C., and a product having an excellent crystalising property, a high sintering property, and a tight structure is produced. Therefore, it has been found that it is possible to realize the mass production of stable piezoelectric ceramic compounds in which the vaporization of lead oxide is small.

FIG. 3A, 3B and 3C illustrate photographs revealing the surface status of a crystal of $0.03La(Mn_{1-4\alpha} Ni_{3\alpha} W_\alpha)O_3 + 0.96Pb(Ti_yZr_{1-y})O_3$ dependent on the value of α. FIGS. 3A, 3B and 3C correspond to α=10/40, α=5/40 and α=0, respectively. Although photographs of FIGS. 3A, 3B and 3C were taken under the condition y=50, similar photographs have been taken even in the case where the value of y is changed. It is observed in FIGS. 3A, 3B and 3C that: a piezoelectric ceramic compound having a uniformity in structure and high density property is formed where the value of α is approximately 5/40; that an anomalous growth appears in the crystal and the density of the ceramics is decreased in accordance with the reduction of the value of α, and; that although no anomalous growth appears in the crystal, the sintering property is deteriorated, the pore eliminating effect is decreased and accordingly pores become distinguished where the value of α is approximately 10/40. It should be noted that the properties of the structures illustrated in FIGS. 3A are superior to those of the prior art structure of $PbTiO_3$-$PbZrO_3$, though they are more or less inferior to those illustrated in FIG. 3B. As a result, the value of the molar fraction α of $(Mn_{1-4\alpha} Ni_{3\alpha} W_\alpha)$ ion should be selected in the range of $3/40 \leq \alpha \leq 10/40$.

Figure 4A:
FIGS. 4A and 4B illustrate electron microscopic photographs revealing the surfaces of compounds in accordance with a prior art and the present invention, respectively.
Figure 4B:

FIGS. 4A and 4B illustrate photographs of the structure of:

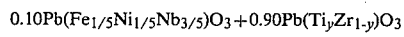

which is a prior art ternery system piezoelectric ceramic compound and the structure of:

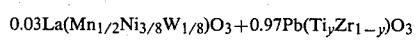

which is an example of the structure in accordance with the present invention, respectively. Although photographs of FIGS. 4A and 4B were taken under the condition y=50, similar photographs have been taken even in the case where the value of y is changed. It is observed in FIGS. 4A and 4B that pores are eminently decreased, and the sintering property is excellent in the structure in accordance with the present invention.

Figure 5:
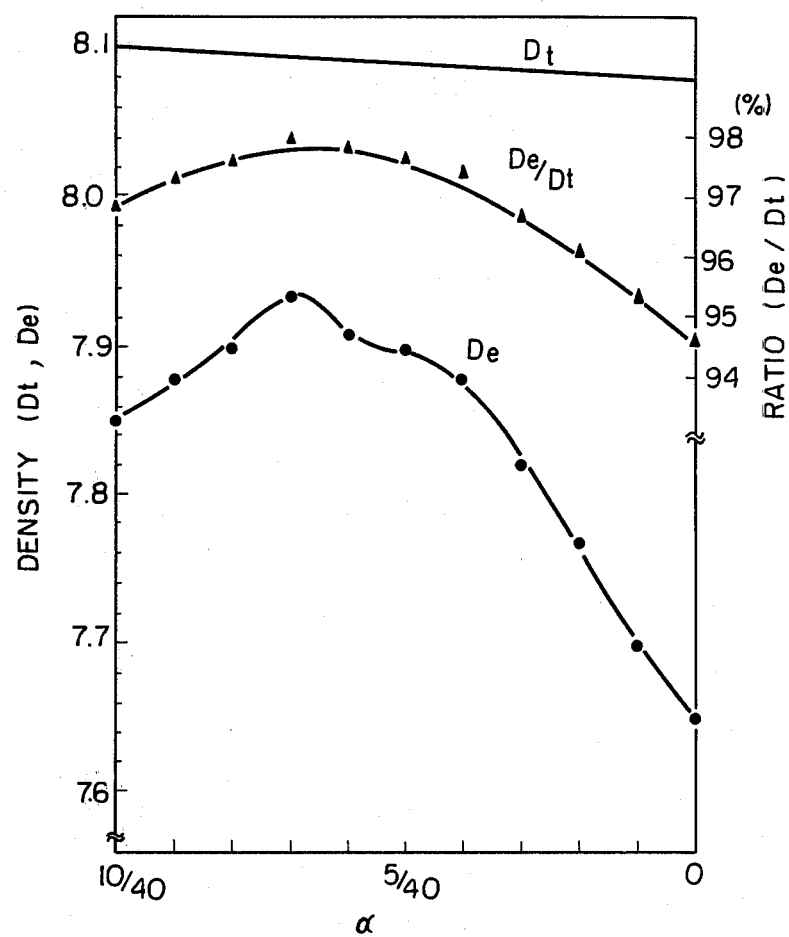
FIG. 5 is a graph showing the changes of density of piezoelectric ceramic compounds in accordance with the present invention.

FIG. 5 shows the apparent density of $0.025 La(Mn_{1-4\alpha} Ni_{3\alpha} W_\alpha)O_3 + 0.495PbTiO_3 + 0.48PbZrO_3$ which is an example of the composition in accordance with the present invention. In FIG. 5, De shows the experimental value density and Dt shows the theoretical value density calculated from the lattice constant obtained by means of the X-ray diffraction. The experimental value density De is 7.93 g/cm³, and the theoretical density ratio De/Dt is 98% where the value of α is approximately 7/40. It has been very difficult to gain such a high value of the theoretical density ratio by means of the normal sintering process for ternary system piezoelectric ceramic compounds. In accordance with the present invention, the compounds having the theoretical density ratio of greater than 97% are easily obtained in the range of $3/40 \leq \alpha \leq 10/40$. These values of the theoretical density ratio in accordance with the present invention are better than either the value from 93% to 95% for the prior art $PbTiO_3$-$PbZrO_3$ structure or the value from 94% to 96% for another prior art $PbTiO_3$-$PbZrO_3$ structure having the solid-soluted third component. Samples, which are used for density measurement shown in FIG. 5, are produced in accordance with the above described production process without a polarizing treatment and are formed in the shape of a plate, the plane of which is a square of 20 mm and the thickness of which is 2 mm. The measurements are conducted in accordance with Archimedes method at 23° C.

In order to explain the electro-mechanical coupling coefficient Kp in connection with the present invention, List 1 is again referred to. Within the range defined by the points A, B, C, D, E, F and G, said points A, B, C, D, E, F and G corresponding to Sample Nos. 1, 2, 3, 4, 5, 6 and 7 of List 1, respectively, the compounds have satisfactory values of the electro-mechanical coupling coefficient Kp which are not less than 25%. It is required that, in the case of the contour vibrations in general, the Kp should be at least not less than 20%. In addition, the inventors have confirmed by experiments that the values of Kp do not reach to 25% outside of the range defined by A, B, C, D, E, F and G in List 1.

The reason for the limitation of molar fraction of the third component within 10 mol.% is explained as follows. If the molar fraction of the third component is greater than 10 mol%, i.e. if the composition is in the range over the line D-E in FIG. 1, an anomalous growth of crystal grains takes place, the Curie Temperature is lowered, the realization of uniformity in structures and high density property becomes difficult, and accordingly, the practicality of compounds is reduced.

Figure 6:
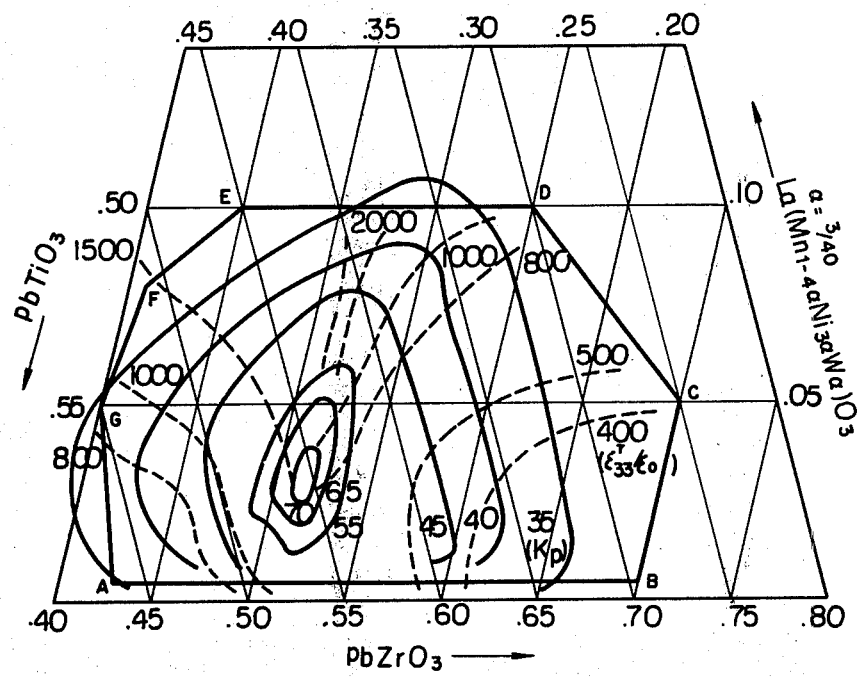
FIG. 6 is a graph showing the changes of dielectric constant and electro-mechanical coupling coefficient of piezoelectric ceramic compounds in accordance with the present invention.

In FIG. 6, the relative dielectric constant ($\epsilon_{33hu\ T}/\epsilon o$) is shown in broken lines and the electro-mechanical coupling coefficient is shown in solid lines with respect to the range A-B-C-D-E-F-G in FIG. 1. In FIG. 6, it is observed that the morphotrophic phase boundary (MP B) inclines to the rhombohedral (Rhomb) side and electro-mechanical coupling coefficients (Kp) in the region of the rhombohedral system show a relatively large value, though relative dielectric constants ($\epsilon_{33}^T/\epsilon o$) show reduced values in the same region. Since there is a need for piezoelectric ceramic compounds having a low relative dielectric constant and a high electro-mechanical coupling coefficient for high frequency piezoelectric filters such as energy trapped type high frequency piezoelectric filters and elastic surface wave devices, the compositions in the region of the rhombo-hedral system in accordance with the present invention are useful for high frequency piezoelectric filters and elastic surface wave devices.

Figure 7:
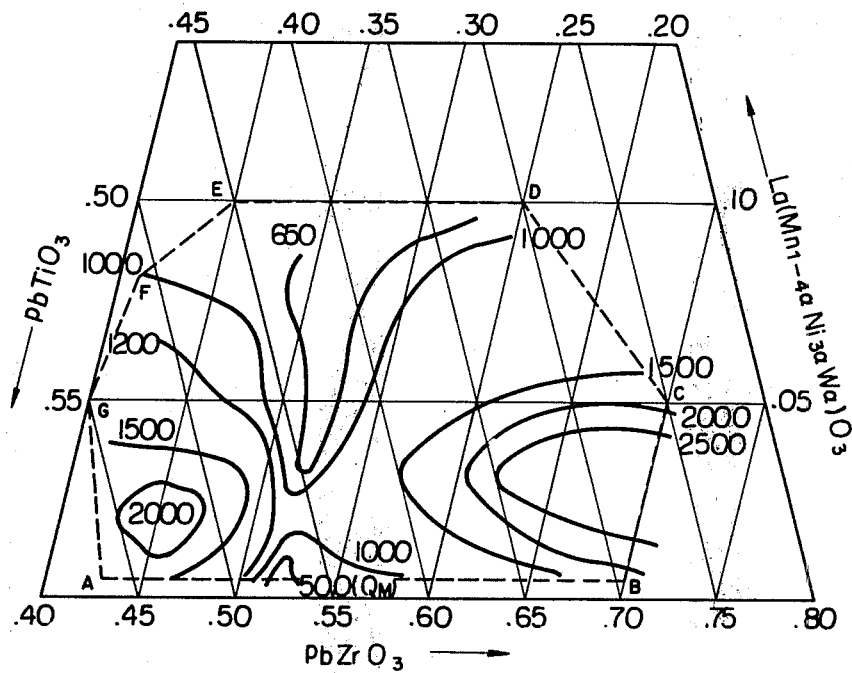
FIG. 7 is a graph showing the changes of mechanical quality factor of the piezoelectric ceramic compounds in accordance with the present invention.

In FIG. 7, the mechanical quality factor $Q_M$ is shown with respect to the range A-B-C-D-E-F-G in FIG. 1. In FIG. 7, it is observed that the values of the mechanical quality factors are high in a wide range within the regions of the rhombohedral system and tetragonal system.

Figure 8:
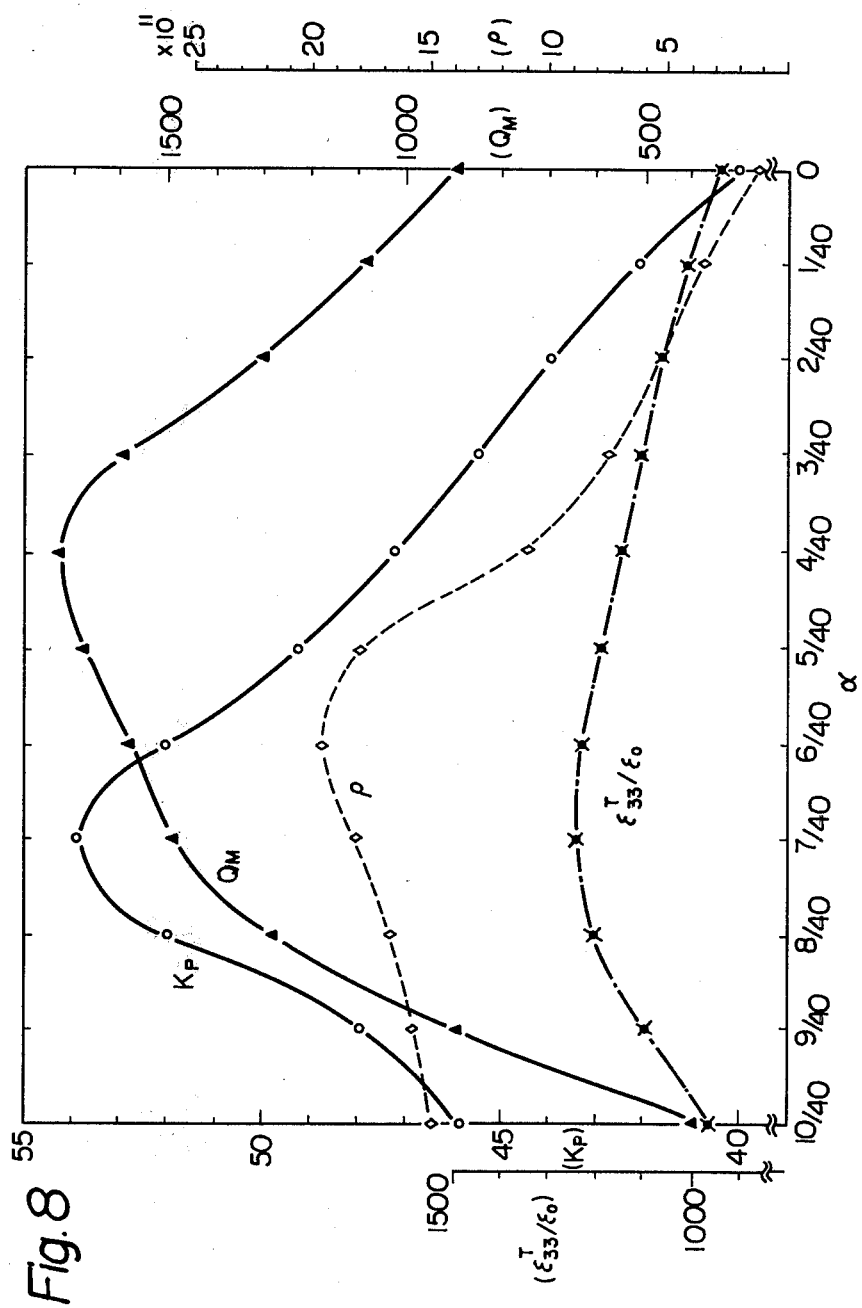
FIG. 8 is a graph showing the changes of specific resistivity, electro-mechanical coupling coefficient, relative dielectric constant and mechanical quality factor, and, FIG. 9 is a graph showing the changes of temperature coefficient of piezoelectric ceramic compounds.

In FIG. 8, the changes of the relative dielectric constant $\epsilon_{33}\%/\epsilon o$, electromechanical coupling coefficient Kp, mechanical quality factor $Q_M$ and specific resistivity $\rho$ of Sample Nos. 18 through 28 in accordance with the change of molar fraction $\alpha$ of the third component La $(Mn_{1-4\alpha} Ni_{3\alpha} W_\alpha)O_3$ at a point in the region of tetragonal system which is 3 mol.% apart from the morphotrophic phase boundary (MPB) point are shown. In FIG. 8, it is observed that the electro-mechanical coupling coefficient Kp shows its maximum value at $\alpha=7/40$ at which point the theoretical density ratio also shows its maximum values as explained hereinbefore with reference to FIG. 5. Thus, the electro-mechanical coupling coefficient and the theoretical density ratio are quite high where the value of $\alpha$ is around 7/40. In addition, in FIG. 8, it is observed that the mechanical quality factor $Q_M$ is greater than 1700 and the electro-mechanical coupling coefficient Kp is greater than 47%, though the specific resistivity $\rho$ is decreased to not greater than $10^{11}\Omega cm$, at $\alpha=4/40$. Thus, the compound also has the properties suitable for piezoelectric filters where the value of $\alpha$ is around 4/40.

List 2

| Sample No. | Specific Resistivity | tan δ | Secular Variation | Theoretical Density by X-ray Diffraction | Density of Sintered Compound | Theoretical Density Ratio | Mechanical Quality Factor |
| --- | --- | --- | --- | --- | --- | --- | --- |
| 18 | 1.3 | 1.2 | 0.03 | 8.078 | 7.65 | 94.7 | 900 |
| 19 | 3.5 | 0.9 | 0.03 | 8.080 | 7.70 | 95.3 | 1100 |
| 20 | 5.4 | 0.7 | 0.04 | 8.082 | 7.77 | 96.1 | 1300 |
| 21 | 7.5 | 0.6 | 0.06 | 8.084 | 7.82 | 96.7 | 1600 |
| 22 | 11.0 | 0.4 | 0.12 | 8.087 | 7.88 | 97.4 | 1730 |
| 23 | 18.0 | 0.3 | 0.25 | 8.089 | 7.90 | 97.7 | 1680 |
| 24 | 19.5 | 0.2 | 0.38 | 8.091 | 7.91 | 97.8 | 1580 |
| 25 | 18.2 | 0.3 | 0.45 | 8.093 | 7.935 | 98.0 | 1500 |
| 26 | 16.7 | 0.3 | 0.40 | 8.095 | 7.90 | 97.6 | 1380 |
| 27 | 15.8 | 0.5 | 0.37 | 8.097 | 7.88 | 97.3 | 900 |
| 28 | 14.9 | 0.7 | 0.27 | 8.10 | 7.85 | 96.9 | 400 |

List 2 shows the secular variation of properties of Sample Nos. 18 through 28 which are calculated as change per 10 years in %. The columns of List 2 are arranged by Sample Number, specific resistivity ($\times 10^{11}\Omega cm$), tan $\rho$ (%), change per 10 years (%) of resonance frequency the initial value of which is the value at 24 hours after polarizing treatment (fr), tehoretical density by X-ray diffraction (g/cm³), density of the sintered compound (g/cm³), theoretical density ratio (%) and mechanical quality factor.

In List 2, it is observed that the value of the secular variation of the resonance frequency is an excellent value of 0.12% per 10 years with regard to Sample No. 22 where $Q_M$ takes its maximum value and $\alpha$ is 4/40. In addition, the values of the secular variation of the resonance frequency are also advantageous values in the region of the rhombohedral system. For piezoelectric filters, it is required that the secular variation should be smaller than 1% per 10 years. Partiuclarly for piezoelectric filters in communication devices and the elastic surface wave devices, it is requred that the secular variation should be much smaller than in the above described case. In connection with these requirements, in List 2, it is observed that Sample Nos. 21 through 28 have a value greater than 1500 of the mechanical quality factor $Q_M$ and a value smaller than 0.5% per 10 years of secular variation of resonance frequency and are accordingly suitable for the above-mentioned piezoelectric filters, piezoelectric filters in communication devices, and the elastic surface wave devices.

List 3 shows temperature coefficients of Sample Nos. 44, and 59 through 64. The temperature coefficient is one of the important properties of piezoelectric ceramic compounds used for piezoelectric filters. In List 3, the variation of resonance frequency $\Delta$ fr/fr(%) at $-20°$ C., the variation of resonance frequency $\Delta$ fr/fr(%) at $80°$ C., the temperature coefficient of resonance frequency $C_f$(ppm/°C.) at $-20°$ C. and the temperature coefficient of resonance frequency $C_f$(pm/°C.) at $80°$ C., where fr is the resonance frequency at $25°$ C., are shown. It should be noted that $\Delta$ fr at $=20°$ C. is calculated as fr at $25°$ C. minus fr at $-20°$ C., while $\Delta$ fr at $80°$ C. is calculated as fr at $80°$ C. minus fr at $25°$ C.

List 3

| Sample No. | Δfr/fr (−20° C.) | Δfr/fr (80° C.) | $C_f$ (−20° C.) | $C_f$ (80° C.) |
|---|---|---|---|---|
| 59 | −0.07 | −0.13 | −16 | −24 |
| 60 | −0.02 | −0.05 | −4 | −9 |
| 61 | +0.06 | −0.03 | +13 | −5 |
| 62 | +0.10 | +0.03 | +22 | +6 |
| 63 | +0.25 | +0.22 | +56 | +40 |
| 64 | +0.19 | +0.14 | +42 | +25 |
| 44 | −0.50 | −0.75 | −110 | −135 |

In List 3, it is observed that the change of resonance frequency due to temperature is relatively small in a wide range of temperatures and the change is linear and has no bend around the range where the temperature coefficient is very close to zero.

Figure 9:
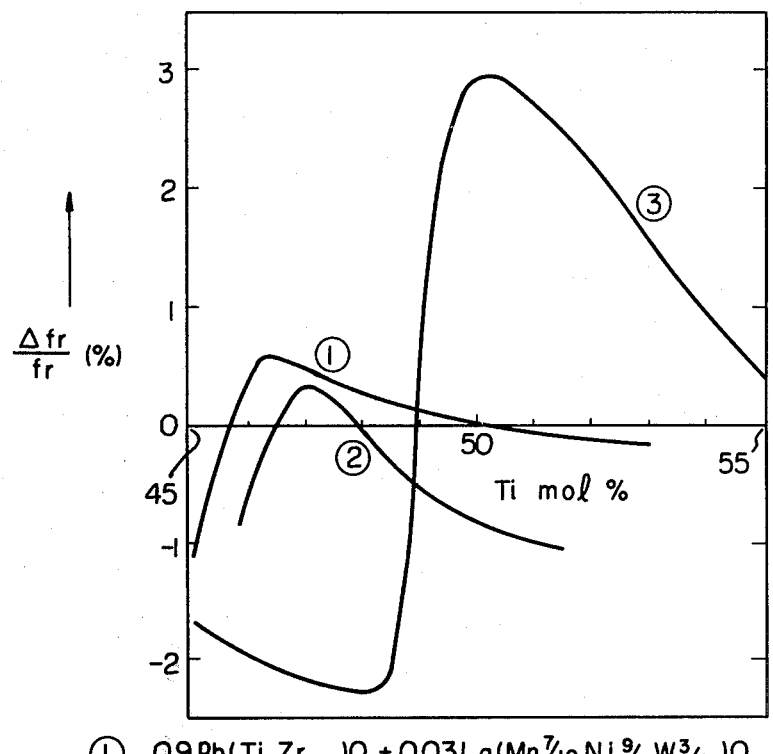

In FIG. 9 the variation of temperature coefficient both of the compounds in accordance with the present invention and of prior art compounds in response to the mol percent of Ti are shown. In FIG. 9, the Curve Nos. 1, 2 and 3 correspond to the following compounds.

$0.97Pb(Ti_xZr_{1-x})O_3 + 0.03La(Mn_{7/10} Ni_{9/40} W_{3/40})O_3$ (1.)

$Pb_{0.95}Sr_{0.05}(Ti_xZr_{1-x})O_3$ (2.)

$0.98Pb(Ti_xZr_{1-x})O_3 - 0.02WO_3 + 0.75wt\% MnO_2$ (3.)

What we claim is:

1. A ternary system piezoelectric ceramic compound represented by a molecular formula $xLa(Mn_{1-4\alpha} Ni_{3\alpha} W_\alpha)O_3 - yPbTiO_3 - zPbZrO_3$ having a composition within the area defined by the points A, B, C, D, E, F and G in the ternary diagram of FIG. 1 the coordinates of said points being:

| | | | |
|---|---|---|---|
| A | (x=0.005, | y=0.565, | z=0.43) |
| B | (x=0.005, | y=0.295, | z=0.70) |
| C | (x=0.05, | y=0.25, | z=0.70) |
| D | (x=0.10, | y=0.30, | z=0.60) |
| E | (x=0.10, | y=0.45, | z=0.45) |
| F | (x=0.08, | y=0.51, | z=0.41) |
| G | (x=0.05, | y=0.55, | z=0.40) | where x, y and z represent molar fractions of constituents of said piezoelectric ceramic compound respectively and x+y+z is equal to unity, the molar fraction $\alpha$ in $(Mn_{1-4\alpha} Ni_{3\alpha} W_\alpha)$ of the x-constituent of said piezoelectric ceramic compound being within the range $3/40 \leq \alpha \leq \frac{1}{4}$.

* * * * *

UNITED STATES PATENT AND TRADEMARK OFFICE
CERTIFICATE OF CORRECTION

PATENT NO. : 4,220,546
DATED : September 2, 1980
INVENTOR(S) : Hiroshi Satomura et al It is certified that error appears in the above—identified patent and that said Letters Patent is hereby corrected as shown below:

Column 1, Line 7 change "(Mn 1-1a" to --(Mn 1-4a--

Column 2, Line 50 change "hour" to --hours--

Column 7, Line 53 change "($\varepsilon_{33}$hu T/$\varepsilon_o$) to --($\varepsilon_{33}$ T/$\varepsilon_o$)

Column 8, Line 7 change "factors" to --factor--

Line 11 change "$\varepsilon_{33}$% /$\varepsilon_o$" to --$\varepsilon_{33}$T/$\varepsilon_o$--

Column 9, Line 1 change "requred" to --required--

Line 22 change "at = 20°C." to --at - 20°C--

Signed and Sealed this

Tenth Day of March 1981

[SEAL]

Attest:

RENE D. TEGTMEYER

Attesting Officer    Acting Commissioner of Patents and Trademark